(12) United States Patent
Kim et al.

(10) Patent No.: US 10,365,687 B2
(45) Date of Patent: Jul. 30, 2019

(54) LAPTOP COMPUTER

(71) Applicant: GIGALANE CO., LTD., Hwaseong-si, Gyeonggi-do (KR)

(72) Inventors: Ik Soo Kim, Hwaseong-si (KR); Byung Yeol Kim, Hwaseong-si (KR); Sang Pil Kim, Hwaseong-si (KR); Byung Hoon Jo, Hwaseong-si (KR); Da Yeon Lee, Hwaseong-si (KR); Hwang Sub Koo, Hwaseong-si (KR); Hyun Je Kim, Hwaseong-si (KR); Hee Seok Jung, Hwaseong-si (KR)

(73) Assignee: GIGALANE CO., LTD., Hwaseong-si, Gyeonggi-do (KR)

( * ) Notice: Subject to any disclaimer, the term of this patent is extended or adjusted under 35 U.S.C. 154(b) by 0 days.

(21) Appl. No.: 16/077,067

(22) PCT Filed: Jul. 5, 2016

(86) PCT No.: PCT/KR2016/007256
§ 371 (c)(1),
(2) Date: Aug. 10, 2018

(87) PCT Pub. No.: WO2017/146315
PCT Pub. Date: Aug. 31, 2017

(65) Prior Publication Data
US 2019/0041907 A1    Feb. 7, 2019

(30) Foreign Application Priority Data
Feb. 26, 2016   (KR) ................ 10-2016-0022970

(51) Int. Cl.
*G06F 1/16* (2006.01)
*H05K 5/00* (2006.01)
*H05K 5/02* (2006.01)

(52) U.S. Cl.
CPC ............ *G06F 1/1618* (2013.01); *G06F 1/16* (2013.01); *G06F 1/1637* (2013.01);
(Continued)

(58) Field of Classification Search
CPC .................................................. H04M 1/0277
(Continued)

(56) References Cited

U.S. PATENT DOCUMENTS

2007/0124930 A1    6/2007  Cheng et al.
2012/0268879 A1*  10/2012  Kim .................... H04M 1/0277
                                                           361/679.09
(Continued)

FOREIGN PATENT DOCUMENTS

JP    2011176653 A    9/2011
KR    200249984 YI    11/2001
KR    1020030060348 A    7/2003

OTHER PUBLICATIONS

International Search Report and Written Opinion for PCT/KR2016/007256 dated Nov. 22, 2016, 16 pages.

*Primary Examiner* — Anthony Q Edwards
(74) *Attorney, Agent, or Firm* — Brundidge & Stanger, P.C.

(57) ABSTRACT

A laptop computer, according to the present invention, comprises: a main body part comprising a mainboard and a coaxial cable, one end of which is connected to the mainboard; and a display part hinge-coupled with the main body part and comprising a flexible printed circuit board which is installed on the back of the display part and has one end thereof coupled with the other end of the coaxial cable.

7 Claims, 13 Drawing Sheets

(52) U.S. Cl.
CPC ......... *G06F 1/1681* (2013.01); *H05K 5/0026* (2013.01); *H05K 5/0086* (2013.01); *H05K 5/0226* (2013.01)

(58) Field of Classification Search
USPC .................................................... 361/679.28
See application file for complete search history.

(56) References Cited

U.S. PATENT DOCUMENTS

| | | | |
|---|---|---|---|
| 2014/0285960 A1* | 9/2014 | Sharma ................. | G06F 1/1654 361/679.28 |
| 2015/0016041 A1* | 1/2015 | Muro .................... | G06F 1/1683 361/679.28 |
| 2016/0054759 A1* | 2/2016 | Lee ....................... | G06F 1/1656 361/679.28 |

* cited by examiner (a)

(b)

(a)

(b)

(c)

(d)

LAPTOP COMPUTER

CROSS-REFERENCE TO RELATED APPLICATIONS

This Application is the National Stage filing under 35 U.S.C. § 371 of PCT Application Ser. No. PCT/KR2016/007256 filed on Jul. 05, 2016, which claims the benefit of Korean Patent Application No. 10-2016-0022970 filed on Feb. 26, 2016. The disclosures of both applications are hereby incorporated herein by reference in their entireties.

TECHNICAL FIELD

The present invention relates to a laptop computer.

BACKGROUND ART

In general, a portable wireless terminal such as a mobile phone, a tablet PC, and a laptop computer includes a main body part and a display part.

FIG. 1 is view illustrating a general laptop computer of the portable wireless terminals, and FIG. 2 is a cross-sectional view taken along line A-A.

As illustrated in FIGS. 1 and 2, the laptop computer includes a main body part 1 and a display part 2. Here, the main body part 1 includes a keyboard 1a, a touch panel 1b, and a mainboard (not shown), the display part 2 includes a display 2a made of liquid crystal or the like and a bezel 2b providing an edge around the display 2a, and the main body part 1 and the display part 2 is hinge-coupled.

In recent years, a technology for decreasing an area of the bezel 2b and increasing an area of the display 2a has been developed to enhance the design of the laptop computer.

However, a coaxial cable 3 for transmitting a RF signal of Wi-Fi or LTE from an antenna to a mainboard is disposed in the bezel 2b. Accordingly, a typical laptop computer has a limitation in that the area of the bezel 2b is difficult to be reduced due to the coaxial cable 3 and a fixture 4 for fixing the coaxial cable 3.

The present inventor has recognized the above limitation of the portable wireless terminal such as the typical laptop computer. Thus, the present invention provides a flexible printed circuit board that is optimized to the portable wireless terminal such as the laptop computer in consideration of an aspect in which, when a flexible printed circuit board is installed on the display part 2 instead of the coaxial cable 3, the area of the bezel 2b is minimized while the area of the display 2a is maximized.

The descriptions of the above-described background knowledge are provided to help understanding of the present invention, but do not limit the scope of the present invention.

DISCLOSURE OF THE INVENTION

Technical Problem

The present invention provides a laptop computer applied with a flexible printed circuit board, which realizes an extended area of a display and a small thickness by applying a coaxial cable to a main body part and a flexible printed circuit board to the back of the display part, and, to this end, the small thickness is realized by planar-arranging a plurality of signal lines in parallel while minimizing signal interference and signal loss.

Technical Solution

In accordance with an embodiment of the present invention, a laptop computer includes: a main body part comprising a mainboard and a coaxial cable, one end of which is connected to the mainboard; and a display part hinge-coupled with the main body part and comprising a flexible printed circuit board which is installed on the back of the display part and has one end coupled with the other end of the coaxial cable.

The display part may include: a display; a lower bezel disposed below the display and in which the other end of the coaxial cable is coupled with one of the flexible printed circuit board; and an upper bezel disposed above the display and in which the other end of the flexible printed circuit board is coupled with an antenna.

The coaxial cable and the flexible printed circuit board may be coupled through one selected from a connector or soldering, and the flexible printed circuit board my have a "T"-shape.

The laptop computer may further include a first antenna and a second antenna, which are connected to an end of the flexible printed circuit board in left and right directions.

The laptop computer may further include a first antenna and a second antenna, which extend from an end of the flexible printed circuit board in left and right directions.

A pair of flexible printed circuit boards may be installed on the back of the display part, and a pair of first antennas and a pair of the second antenna may be provided, the pair of first antennas may transceive a short range communication signal, and the pair of second antennas may transceive a wireless mobile communication signal and be disposed between the pair of first antennas.

The flexible printed circuit board may include a first substrate part including a first signal line and a second substrate part including a second signal line in parallel to the first signal line, and the first substrate part and the second substrate part may be disposed on the same plane with a shielding part therebetween.

Advantageous Effects

In accordance with the present invention, following various effects may be realized.

First, as the size of the bezel is minimized, the laptop computer having the wider display may be realized.

Second, the laptop computer that is easily assembled by using the flexible printed circuit board and the coaxial cable may be realized.

Third, since the length of the flexible printed circuit board is minimized, the signal loss may be minimized, and the costs may be also reduced.

Fourth, the antenna may be disposed on each of both upper ends of the display part to stably receive a signal.

Fifth, the display part may in minimized in thickness.

Sixth, the signal interference, which may be generated between the first signal line and the second signal line, may be minimized.

Seventh, the signal loss may be minimized.

-Description of symbol-

Figure 1:
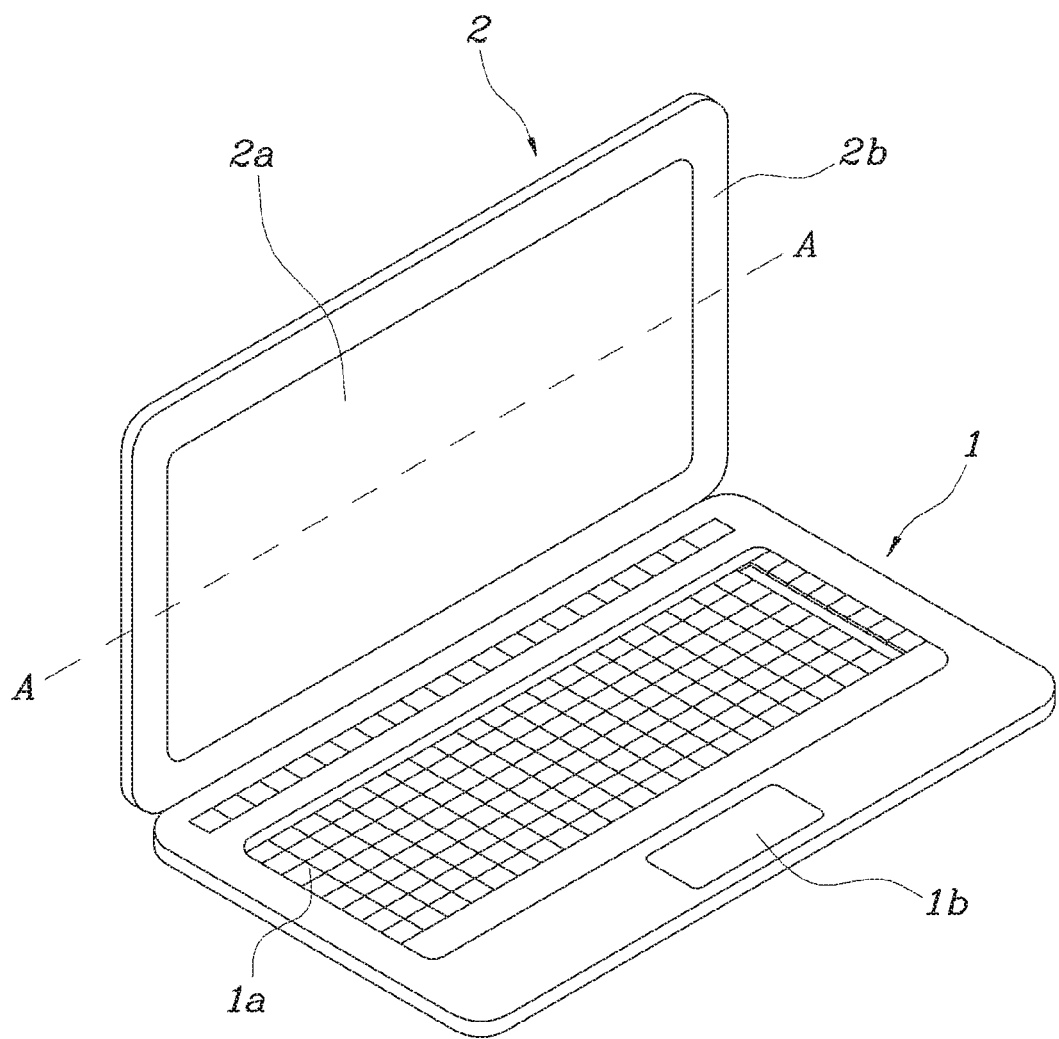
FIG. 1 is a view illustrating a general laptop computer.
Figure 2:
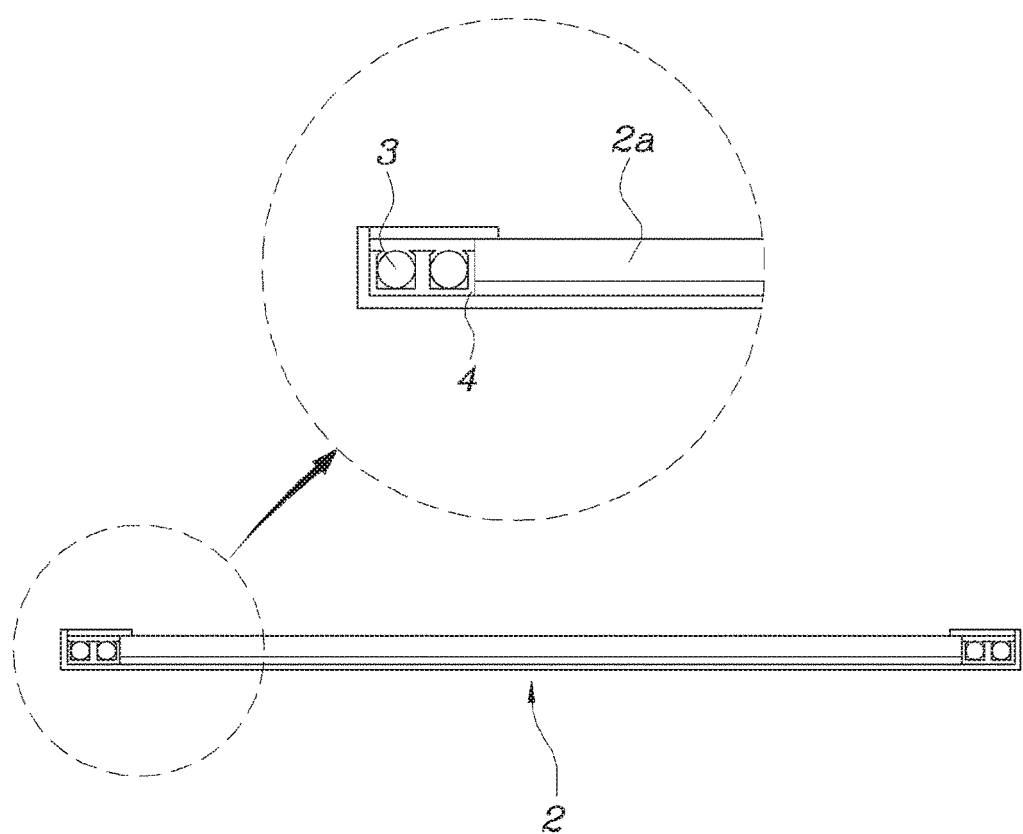
FIG. 2 is a cross-sectional view taken along line A-A of FIG. 1.

| | |
|---|---|
| 100: Main body part | 110: Coaxial cable |
| 200: Display part | 210: Flexible printed circuit board |
| 212: First antenna | 214: Second antenna |
| 220: Display | 230: Upper bezel |
| 240: Lower bezel | 10: First substrate part |
| 20: Second substrate part | 30: Shielding part |
| E1: First dielectric layer | E2: Second dielectric layer |
| E3: Third dielectric layer | G1: First ground layer |
| G2: Second ground layer | S1: First side ground |
| S2: Second side ground | C1: First central ground |
| C2: Second central ground | T1: First signal line |
| T2: Second signal line | P: Coupling part |
| P1: First coupling part | P2: Second coupling part |
| V1: First via hole | V2: Second via hole |
| V3: Third via hole | V4: Fourth via hole |
| L1: First line | L2: Second line |
| H: Ground hole | C: Connector |
| M: Mainboard | |

MODE FOR CARRYING OUT THE INVENTION

The objects, characteristics and effects of the inventive concept will become apparent with the detailed descriptions of the preferred embodiment and the illustrations of related drawings as follows. In every possible case, like reference numerals are used for referring to the same or similar elements in the description and drawings. It will be understood that although the terms of first and second are used herein to describe various elements, these elements should not be limited by these terms. The terms are only used to distinguish one component from other components. Moreover, detailed descriptions related to well-known functions or configurations will be ruled out in order not to unnecessarily obscure subject matters of the present disclosure.

Hereinafter, specific embodiments will be described in detail with reference to the accompanying drawings.

Figure 3:
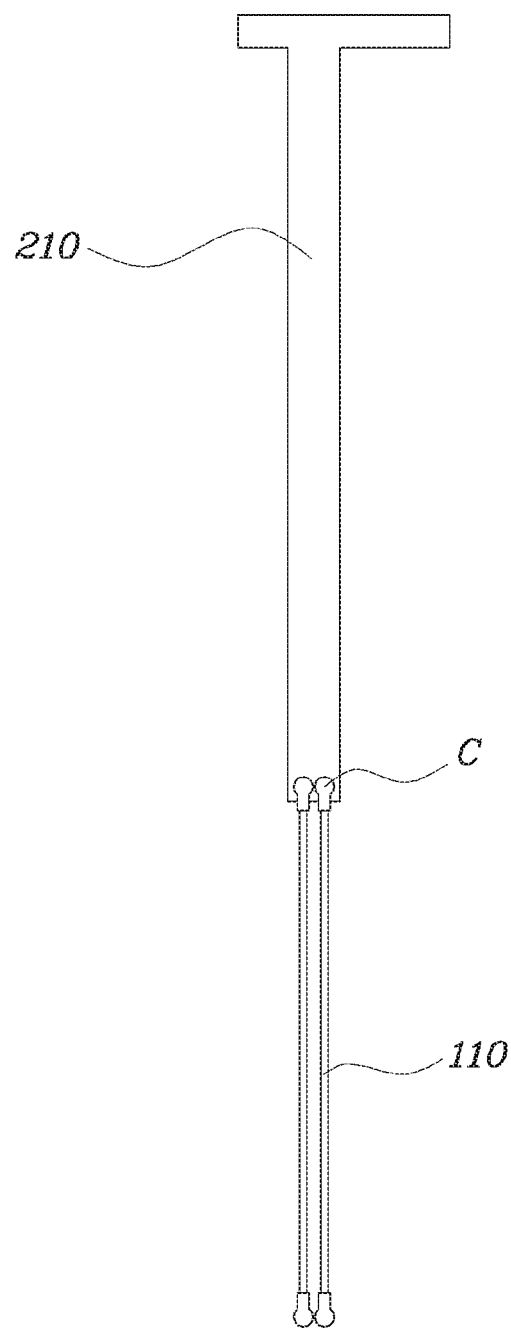
FIG. 3 is a view illustrating an appearance of a flexible printed circuit board that is applied to a laptop computer in accordance with the present invention.
Figure 4:
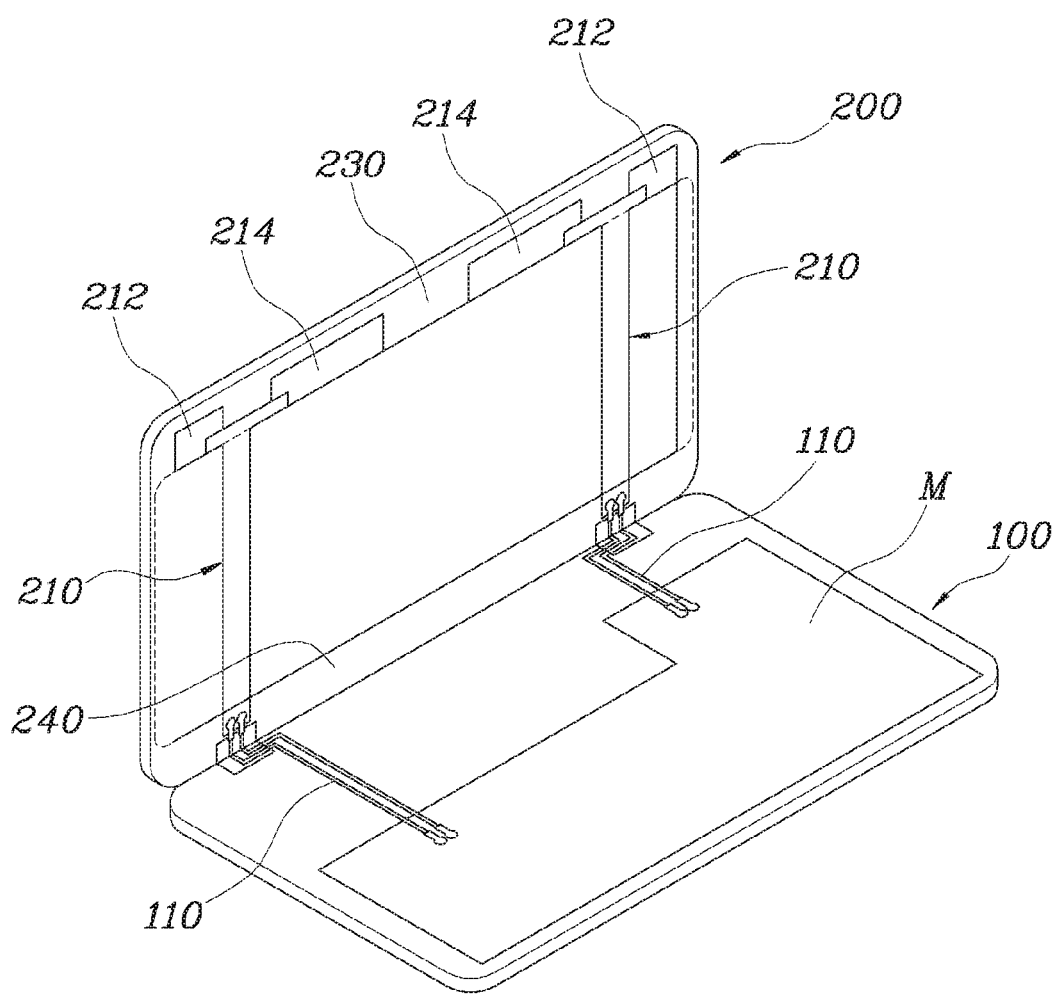
FIG. 4 is a view illustrating one embodiment of the laptop computer in accordance with the present invention.
Figure 5:
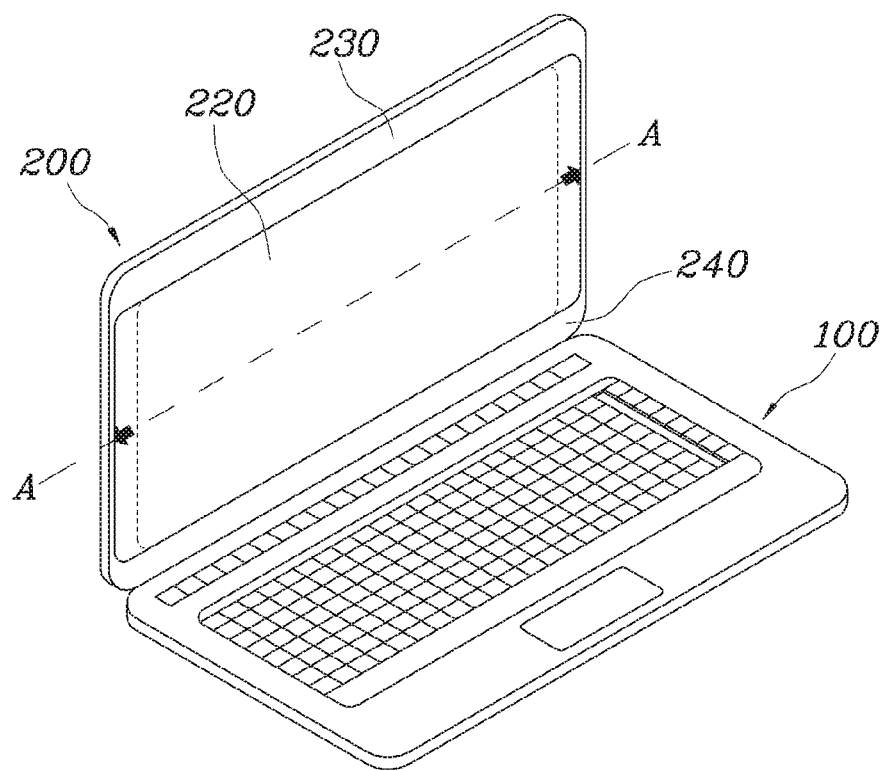
FIGS. 5A and 5B are views illustrating an extension effect of a display of the laptop computer in accordance with the present invention.
Figure 5:
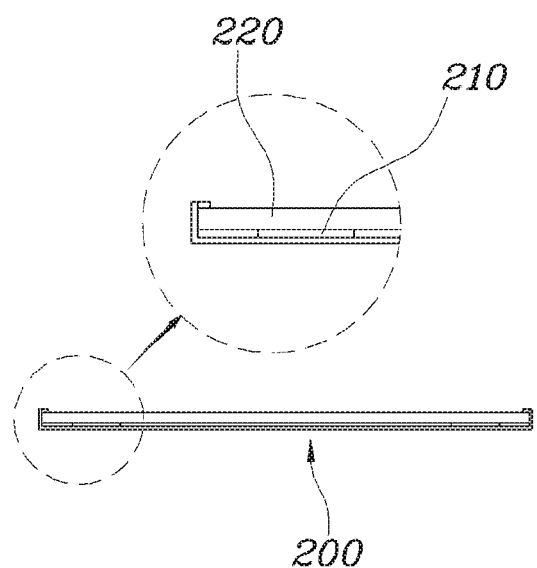

As illustrated in FIGS. 3 to 5, a laptop computer in accordance with the present invention includes a main body part 100 and a display part 200.

The main body part 100 includes a mainboard M and a coaxial cable 110, one end of which is connected to the mainboard M, the display part 200 includes a flexible printed circuit board 210. Here, the flexible printed circuit board 210 is installed on a back of the display part 200, and one end of the flexible printed circuit board 210 is coupled with the other end of the coaxial cable 110.

The main body part 100 is desirably hinge-coupled with the display part 200. Here, the display part 200 may include a display 220, a lower bezel 240, and an upper bezel 230.

The lower bezel 240 is disposed below the display 220, and, in this lower bezel 240, the coaxial cable 110 is coupled with one end of the flexible printed circuit board 210.

The upper bezel 230 is disposed above the display 220, and, in this upper bezel 230, antennas 212 and 214 are connected to the other end of the flexible printed circuit board 210.

As described above, the laptop computer in accordance with the present invention include the flexible printed circuit board 210 disposed on the back of the display part 200 instead of the coaxial cable 110. Accordingly, the laptop computer in accordance with the present invention has an advantage in that the bezel area disposed at a side surface of the display part 200 is minimized, and the area of the display 220 extends.

That is, since the flexible printed circuit board 210 does not require a fixture, unlike the coaxial cable 110, the flexible printed circuit board 210 may be minimized in thickness and installed on the back of the display 220. Thus, more wider display 220 may be realized, and furthermore the laptop computer having a smaller thickness may be realized.

Also, the antennas 212 and 214 and the mainboard M are generally connected by a medium of one of the coaxial cable 110 or the flexible printed circuit board 210. However, as the flexible printed circuit board 210 and the coaxial cable 110 are simultaneously applied, the laptop computer in accordance with the present invention may be easily assembled even in a narrow space such as a hinge, reduce signal loss by minimizing a length of the flexible printed circuit board 210, and save costs.

The coaxial cable 110 disposed on the main body part 100 and the flexible printed circuit board 210 disposed on the back of the display 220 are connected by one selected from a connector C or soldering. Here, the flexible printed circuit board 210 may have a "T"-shape, and thus flexible printed circuit board 210 may have both ends connected to the first antenna 212 and the second antenna 214, respectively.

A pair of flexible printed circuit boards 210 are installed on the back of the display part 200, and a pair of first antennas 212 and a pair of second antennas 214 are provided. Desirably, the pair of first antennas 212 transceive a short range communication signal such as WIFI, and the pair of second antennas 214 transceive a wireless mobile communication signal such as 3G and 4G.

Here, the pair of first antennas 212 are installed on both ends of the upper bezel 230, respectively, and the pair of second antennas 214 are spaced a predetermined distance from each other and installed between the pair of first antennas 212. In this case, the laptop computer in accordance with the present invention may minimize signal interference that may be generated between the first antenna 212 and the second antenna 214 to stably receive a signal.

Also, desirably, one end, which is connected to the first antenna 212, of both ends of the flexible printed circuit board 210 has a length greater than the other end, which is connected to the second antenna 214, thereof in order to minimize the signal interference between the first antenna 212 and the second antenna 214.

Figure 6:
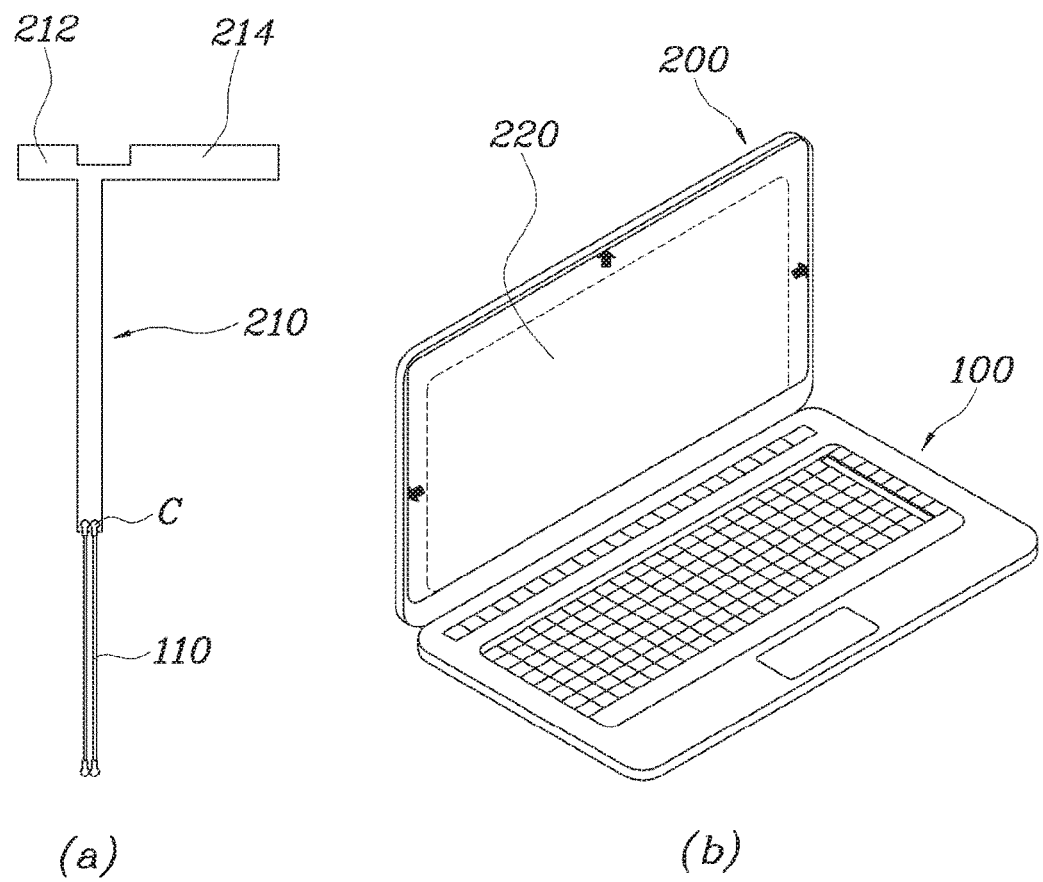
FIG. 6A is a view illustrating another appearance of the flexible printed circuit board that is applied to the laptop computer in accordance with the present invention.
FIG. 6B is a view illustrating an extension effect of a display of the laptop computer in accordance with the present invention.

As illustrated in FIGS. 6A and 6B, the flexible printed circuit board 210 of the laptop computer in accordance with the present invention may further include the first antenna 212 and the second antenna 214, which extend from an end thereof in left and right directions. That is, the first antenna 212 and the second antenna 214 are integrated at the end of the flexible printed circuit board 210. Accordingly, the area of the upper bezel 230 may be minimized, and thus the overall area of the display 220 may increase.

Here, in order to minimize the signal interference between the first antenna 212 and the second antenna 214, desirably, the flexible printed circuit board 210 may have a "F"-shape, so that an extension position of the second antenna 214 is further away from a center of the flexible printed circuit board 210 in a vertical direction than an extension position of the first antenna 212.

Hereinafter, a constitution of the flexible printed circuit board that is applied to the laptop computer in accordance with the present invention will be described in detail. The flexible printed circuit board described below allows the thickness of the laptop computer to be minimized.

Figure 7:
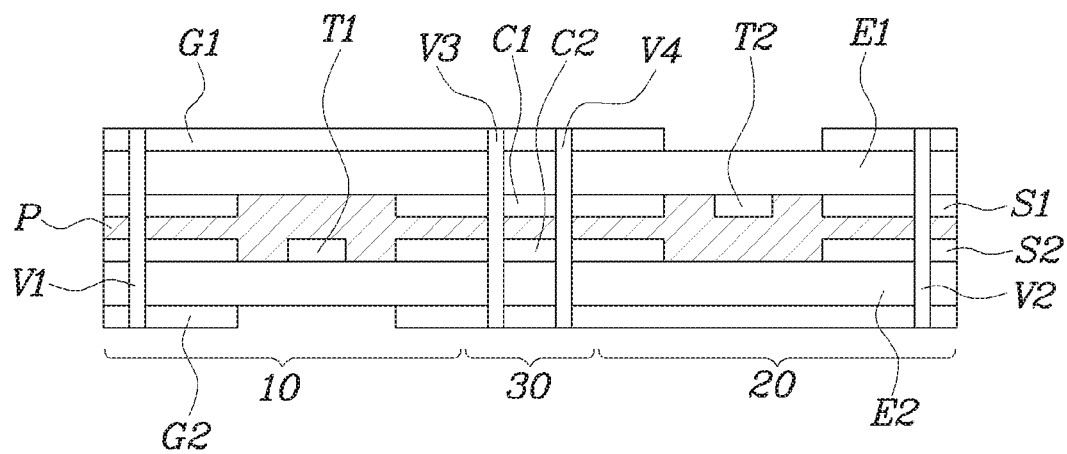
FIG. 7 is a cross-sectional view illustrating a first embodiment of the flexible printed circuit board that is one main portion of the present invention.

FIG. 7 is a cross-sectional view illustrating a first embodiment of the flexible printed circuit board that is one main portion of the present invention.

As illustrated in FIG. 7, the flexible printed circuit board, which is one main portion, includes a first substrate part 10, a second substrate part 20, and a shielding part 30.

The first substrate part 10 and the second substrate part 20 are disposed on the same plane with the shielding part 30 therebetween. Accordingly, a first signal line T1 provided in the first substrate part 10 and a second signal line T2 provided in the second substrate part 20 are disposed in parallel to each other.

As described above, since the first substrate part 10 and the second substrate part 20 are disposed on the same plane, the flexible printed circuit board, which is one main portion of the present invention, may be realized with a small thickness. Also, since the first signal line T1 and the second signal line T2 are disposed with the shielding part 30 therebetween, a signal loss due to the signal interference therebetween may be minimized.

The flexible printed circuit board, which is one main portion of the present invention, may include a first dielectric layer E1, a second dielectric layer E2, a pair of first side grounds S1, a pair of second side grounds S2, a first central ground C1, and a second central ground C2.

The first dielectric layer E1 and the second dielectric layer E2 are spaced a predetermined distance from each other in a vertical direction while being parallel to each other and have shapes corresponding to each other.

The pair of first side grounds S1 are laminated on a bottom surface of the first dielectric layer E1 while spaced a predetermined distance from each other, and the pair of second side grounds S2 are laminated on a plane of the second dielectric layer E2 while spaced a predetermined distance from each other.

The bottom surface of the first dielectric layer E1 and the plane of the second dielectric layer E2 face each other, and bottom surfaces of the pair of first side grounds S and a plane of the second side ground S2 also face each other while spaced a predetermined distance from each other in the vertical direction.

The first central ground C1 is disposed between the pair of first side grounds S1 while being laminated on the bottom surface of the first dielectric layer E1, and the second central ground C2 is disposed between the pair of second side grounds S1 while being laminated on the plane of the second dielectric layer E2. The first central ground C1 and the second central ground C2 have shapes corresponding to each other and are disposed in parallel to each other while spaced a predetermined distance in the vertical direction.

As described above, the first substrate part 10, in which the first signal line T1 is provided, and the second substrate part 20, in which the second signal line T2 is provided, are disposed on the same plane with the shielding part 30 therebetween. Here, with reference to a region in which the first central ground C1 and the second central ground C2 are disposed, one side region may be defined as the first substrate part 10, and the other side region may be defined as the second substrate part 20. Also, the region in which the first central ground C1 and the second central ground C2 are disposed may be defined as the shielding part 30.

Here, the first central ground C1 and the second central ground C2 may extend upto the region of the first and second substrate part 10 and 20 as well as the region of the shielding part 30.

Since the first signal line T1 and the second signal line T2 are disposed with the first central ground C1 and the second central ground C2 therebetween, the signal interference, which may be generated between the first signal line T1 and the second signal line T2, may be prevented.

Although the first signal line T1 is disposed on the plane of the second dielectric layer E2, and the second signal line T2 is disposed on the bottom surface of the first dielectric layer E1 in FIG. 7, the arrangement structure between the first signal line T1 and the second signal line T2 may be variously varied in accordance with the purpose of a designer.

The bottom surface of the first dielectric layer E1 and the plane of the second dielectric layer E2, facing surfaces of the first central ground C1 and the second central ground C2, facing surfaces of the first side ground S1 and the second side ground S2, facing surfaces of the first signal line T1 and the first dielectric layer E1, and facing surfaces of the second signal line T2 and the second dielectric layer E2 may be coupled to each other by using a coupling part P as a medium.

Since the coupling part P may be various kinds of adhesion media such as a dielectric layer, which is deformed during high temperature pressure coupling, or a bonding sheet, a constitution of the coupling part P may be variously varied in accordance with the purpose of the designer.

Figure 8:
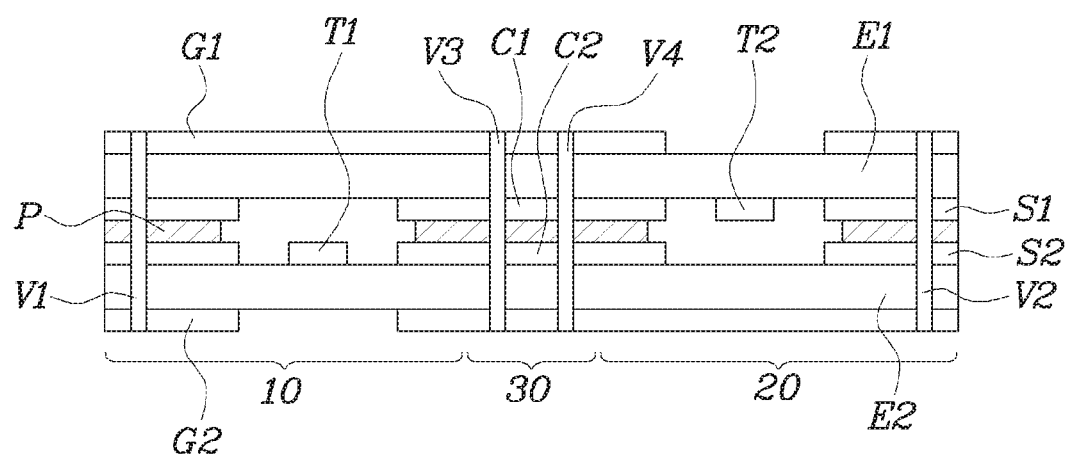
FIG. 8 is a cross-sectional view illustrating a second embodiment of the flexible printed circuit board that is one main portion of the present invention.

As illustrated in FIG. 8, a second embodiment of the flexible printed circuit board, which is one main portion of the present invention, is the same as the above-described first embodiment, except for an installation region of the coupling part P.

In the description of the second embodiment, description on other components except for the coupling part P will be substituted by the above description in the first embodiment. Hereinafter, the installation region of the coupling part P, which is different from that of the first embodiment, will be mainly described.

The coupling part P is installed so that the first signal line T1 and the second signal line T2 are exposed to an air layer.

That is, only the facing areas of the first side ground S1 and the second side ground S2 and the facing areas of the first central ground C1 and the second central ground C2 are coupled to each other by using the coupling part P as a medium.

The air layer may be formed between the facing surfaces of the first dielectric layer E1 and the second dielectric layer E2, and the first signal line T1 and the second signal line T2 may be exposed to the air layer having a low dielectric constant. Thus, capacitance may be reduced to minimize a signal loss.

Although the flexible printed circuit board, which is one main portion of the present invention, may have a two-layered dielectric layer structure like the above-described first embodiment and second embodiment, the flexible printed circuit board may also have a three-layered dielectric layer structure like a third embodiment and a fourth embodiment, which will be described below.

In the third embodiment and the fourth embodiment of the flexible printed circuit board, the first substrate part 10 and the second substrate part 20 are disposed on the same plane with the shielding part 30 therebetween like the first and second embodiments. Hereinafter, a detailed constitution thereof will be described.

Figure 9:
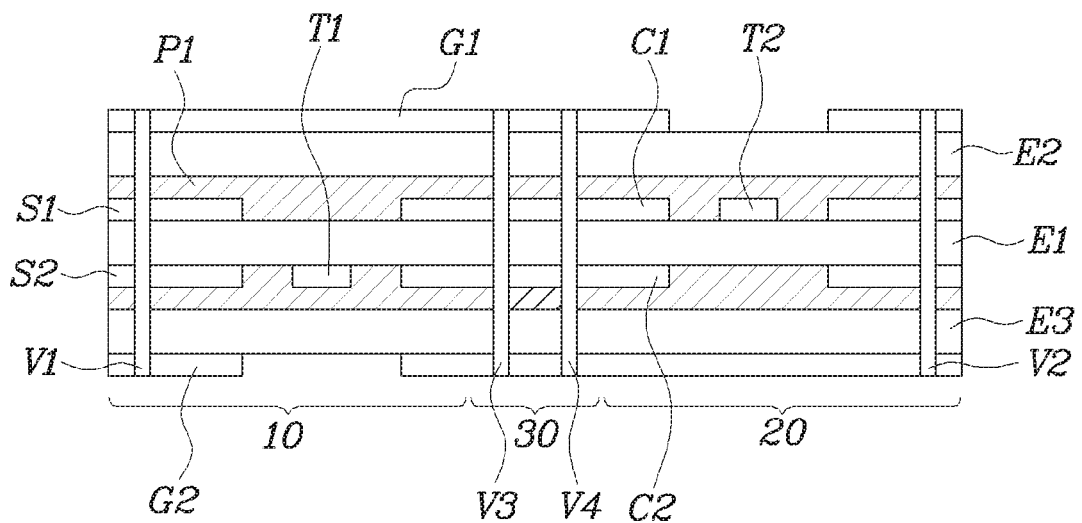
FIG. 9 is a cross-sectional view illustrating a third embodiment of the flexible printed circuit board that is one main portion of the present invention.

As illustrated in FIG. 9, the third embodiment of the flexible printed circuit board, which is one main portion of the present invention, includes a first dielectric layer E1, a second dielectric layer E2, a third dielectric layer E3, a pair of first side grounds S1, a pair of second side grounds S2, a first central ground C1, and a second central ground C2.

With respect to the first dielectric layer E1, the second dielectric layer E2 is disposed thereabove while spaced a predetermined distance therefrom, and the third dielectric layer E3 is disposed therebelow while spaced a predetermined distance therefrom. The first dielectric layer E1, the second dielectric layer E2, and the third dielectric layer E3 have shapes corresponding to each other and parallel to each other.

Also, the pair of first side grounds S1 are laminated on a plane of the first dielectric layer E1 while spaced a predetermined distance from each other, and the pair of second side grounds S2 are laminated on a bottom surface of the first dielectric layer E1 while spaced a predetermined distance from each other.

Since the first side ground S1 and the second side ground S2 may have the same shape and area as each other, the first side ground S1 and the second side ground S2 may be variously varied in accordance with the purpose of the designer.

The first central ground C1 is disposed between the pair of first side grounds S1 while being laminated on the plane of the first dielectric layer E1, and the second central ground C2 is disposed between the pair of second side grounds S2 while being laminated on the bottom surface of the first dielectric layer E1.

As described in the first and second embodiments, in the third embodiment, with reference to a region in which the first central ground C1 and the second central ground C2 are disposed, one side region may be defined as the first substrate part 10, and the other side region may be defined as the second substrate part 20. Also, the region in which the first central ground C1 and the second central ground C2 are disposed may be defined as the shielding part 30.

Here, the first central ground C1 and the second central ground C2 may extend upto the region of the first and second substrate part 10 and 20 as well as the region of the shielding part 30.

The first signal line T1 is disposed between the second side ground S2 and the second central ground C2, which are disposed at one side of the first dielectric layer E1, and the second signal line T2 is disposed between the first side ground S1 and the first central ground C1, which are disposed at the other side of the first dielectric layer E1. That is, the signal interference, which may be generated between the first signal line T1 and the second signal line T2, may be prevented by the first central ground C1 and the second central ground C2.

Also, in case of the three-layered dielectric layer structure, the flexible printed circuit board may shield the signal interference, which may be generated due to other components thereabove and therebelow.

In accordance with the third embodiment of the flexible printed circuit board, which is one main portion of the present invention, facing surfaces of the first dielectric layer E1 and the second dielectric layer E2, facing surfaces of the first central ground C1 and the second dielectric layer E2, facing surface of the first side ground S1 and the second dielectric layer E2, and facing surface of the second signal line T2 and the second dielectric layer E2 are coupled to each other by using a first coupling part P1 as a medium, and facing surface of the first dielectric layer E1 and the third dielectric layer E3, facing surface of the second central ground C2 and the third dielectric layer E3, facing surface of the second side ground S2 and the third dielectric layer E3, and facing surface of the first signal line T1 and the third dielectric layer E3 may be coupled to each other by using the second coupling part P2 as a medium.

Since each of the coupling part P1 and the second coupling part P2 may be various kinds of adhesion media such as a dielectric layer, which is deformed during high temperature pressure coupling, or a bonding sheet, constitutions of the first and second coupling part P1 and P2 may be variously varied in accordance with the purpose of the designer.

Figure 10:
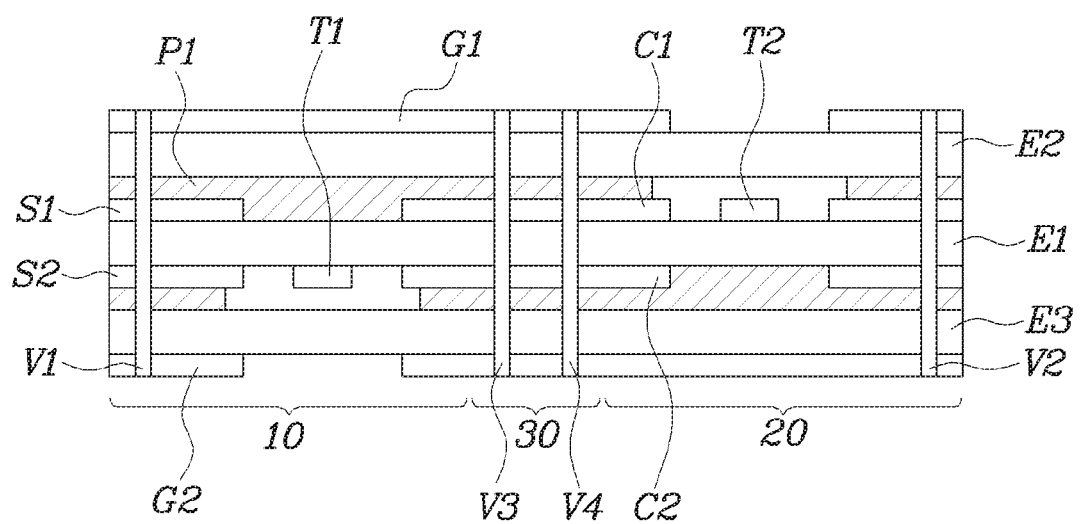
FIG. 10 is a cross-sectional view illustrating a fourth embodiment of the flexible printed circuit board that is one main portion of the present invention.

As illustrated in FIG. 10, the fourth embodiment of the flexible printed circuit board, which is one main portion of the present invention, is the same as the above-described third embodiment, except for installation regions of the first and second coupling parts P1 and P2.

In the description of the fourth embodiment, description on other components except for the first and second coupling parts P1 and P2 will be substituted by the above description in the third embodiment. Hereinafter, the installation regions of the first and second coupling parts P1 and P2, which are different from that of the third embodiment, will be mainly described In accordance with the fourth embodiment of the flexible printed circuit board, which is one main portion of the present invention, since, with respect to the shielding part 30, the first substrate part 10 is disposed at one side of the shielding part 30, and the second substrate part 20 is disposed at the other side of the shielding part 30, the second signal line T2 is disposed between the first central ground C1 in the region of the shielding part 30 and the first side ground S1 in the region of the second substrate part 20, and the first signal line T1 is disposed between the second side ground S2 in the region of the first substrate part 10 and the second central ground C2 in the region of the shielding part 30.

The first coupling part P1 is disposed between the first dielectric layer E1 and the second dielectric layer E2 to couple the first and second dielectric layers E1 and E2 to each other, and the second coupling part P2 is disposed between the first dielectric layer E1 and the third dielectric layer E2 to couple the first and third dielectric layers E1 and E3 to each other Here, the second coupling part P2 is removed from the region in which the first signal line T1 of the first substrate part 10 is installed, so that the first signal line T1 is exposed to an air layer. Also, the first coupling part P1 is removed from the region in which the second signal line T2 of the second substrate part 20 is installed, so that the second signal line T2 is exposed to the air layer.

In more detail, in the region of the first substrate part 10, each of the first side ground S1 and the second dielectric layer E2, the first dielectric layer E1 and the second dielectric layer E2, and the first central ground C1 and the second dielectric layer E2 is coupled through a medium of the first coupling part P1, and, in the region of the shielding part 30, the first central ground C1 and the second dielectric layer E2 are also coupled through a medium of the first coupling part P1. Here, in the region of the second substrate part 20, only each of the first central ground C1 and the second dielectric layer E2, and the first side ground S1 and the second dielectric layer E2 is coupled through a medium of the first coupling part P1, so as to expose the second signal line T2 to the air layer.

Also, in the region of the second substrate part 20, each of the second side ground S2 and the third dielectric layer E3, the first dielectric layer E1 and the third dielectric layer E3, and the second central ground C2 and the third dielectric layer E3 is coupled through a medium of the second coupling part P2, and, in the region of the shielding part 30, the second central ground C2 and the third dielectric layer E3 are also coupled through a medium of the second coupling part P2. Here, in the region of the first substrate part 10, only each of the second central ground C2 and the third dielectric layer E3, and the second side ground S2 and the third dielectric layer E3 is coupled through a medium of the second coupling part P2, so as to expose the first signal line T1 to the air layer.

As described above, since the first signal line T1 and the second signal line T2 are exposed to the air layer having a low dielectric constant, the flexible printed circuit board decreases in capacitance to minimize the signal loss.

As illustrated in FIGS. 7 to 10, a plurality of via holes V1, V2, V3, and V4 may be defined in the flexible printed circuit board, which is one main portion of the present invention.

As illustrated in FIGS. 7 and 8, in the flexible printed circuit board having the second layered dielectric layer structure, a first ground layer G1 is laminated on the plane of the first dielectric layer E1, and a second ground layer G2 is laminated on the bottom surface of the second dielectric layer E2. Accordingly, the first via hole V1 vertically passes through the region of the first substrate part 10, which is disposed at one side of the shielding part 30, and the second via hole V2 vertically passes through the region of the second substrate part 20, which is disposed at the other side of the shielding part 30.

Also, the third via hole V3 and the fourth via hole V4 vertically passes through the shielding part 30 while spaced a predetermined distance in a width direction.

As the first via hole V1 and the second via hole V2 pass through the first ground layer G1, the first dielectric layer E1, the first side ground S1, the coupling part P, the second side ground S2, the second dielectric layer E2 and the second ground layer G2, the first side ground S1, the second side ground S2, the first ground layer G1, and the second ground layer G2 are electrically connected.

As the third via hole V3 and the fourth via hole V4 pass through the first ground layer G1, the first dielectric layer E1, the first central ground C1, the coupling part P, the second central ground C2, the second dielectric layer E2, and the second ground layer G2, the first central ground C1, the second central ground C2, the first ground layer G1, and the second ground layer G2 are electrically connected.

As illustrated in FIGS. 9 and 10, the first via hole V1, the second via hole V2, the third via hole V3, and the fourth via hole V4 may be defined in the flexible printed circuit board having the three-layered dielectric layer structure. Here, as described above, the first via hole V1 may be defined in the region of the first substrate part 10, the second via hole V2 may be defined in the region of the second substrate part 20, and the third via hole V3 and the fourth via hole V4 may be defined in the region of the shielding part 30.

As the first via hole V1 and the second via hole V2 pass through the first ground layer G1, the second dielectric layer E2, the first coupling part P1, the first side ground S1, the first dielectric layer E1, the second side ground S2, the second coupling part P2, the third dielectric layer E3, and the second ground layer G2, the first side ground S1, the second side ground S2, the first ground layer G1, and the second ground layer G2 are electrically connected.

As the third via hole V3 and the fourth via hole V4 pass through the first ground layer G1, the second dielectric layer E2, the first coupling part P1, the first central ground C1, the first dielectric layer E1, the second central ground C2, the second coupling part P2, the third dielectric layer E3, and the second ground layer G2, the first side ground S1, the second side ground S2, the first ground layer G1, and the second ground layer G2 are electrically connected.

Figure 11:
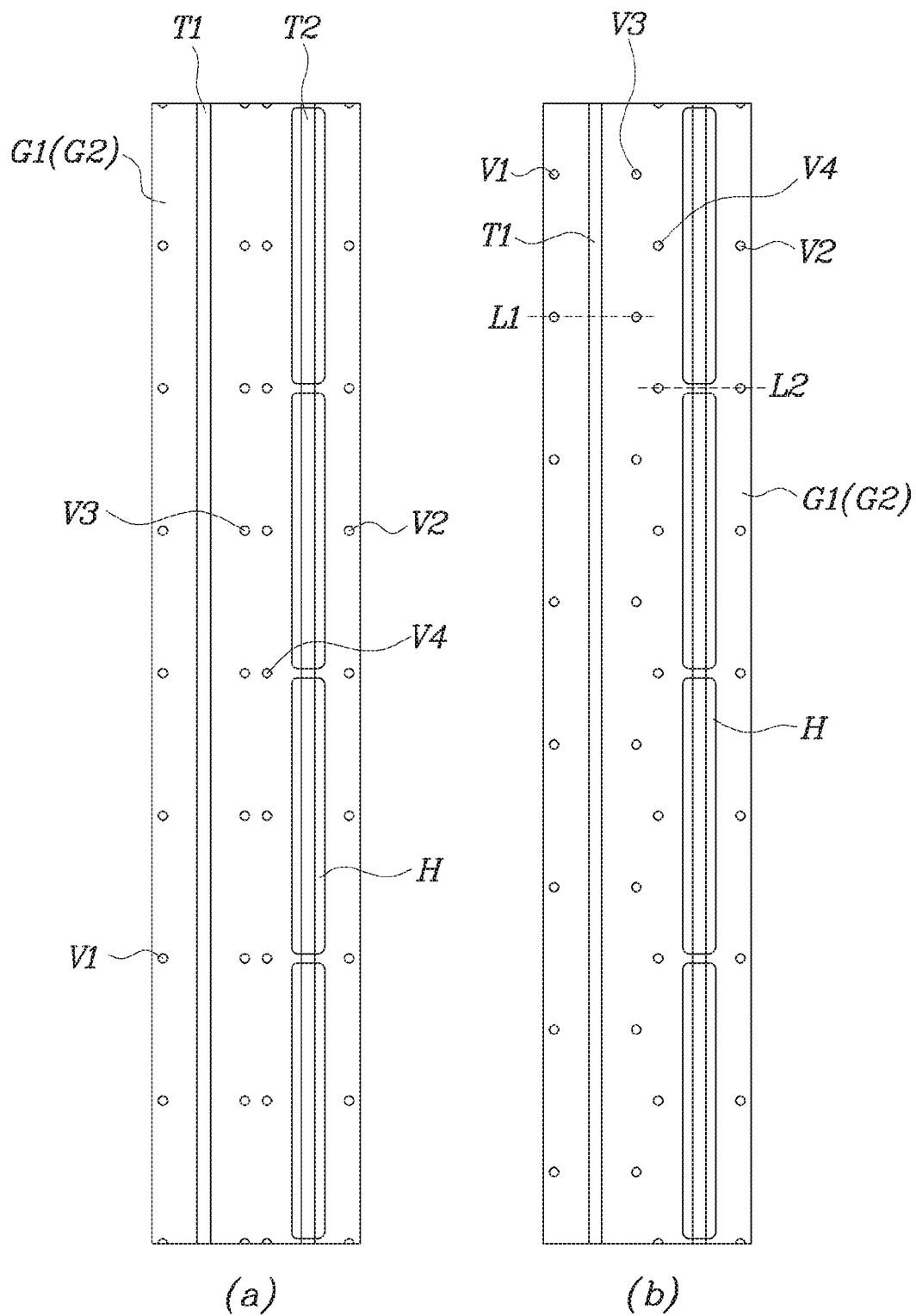
FIGS. 11A and 11B are views illustrating embodiments, which are different from each other, of a via hole of the flexible printed circuit board that is one main portion of the present invention.

As illustrated in FIG. 11A, the first via hole V1, the second via hole V2, the third via hole V3, and the fourth via hole V4 may be disposed on the same line in the width direction of the flexible printed circuit board. Also, as illustrated in FIG. 11B, the first via hole V1 and the third via hole V3 are disposed on a first line L in the width direction, and the second via hole V2 and the fourth via hole V4 are disposed on a second line L2 in the width direction. Here, the first line L1 and the second line L2 do not meet each other.

As described above, when the plurality of via holes V1, V2, V3, and V4 are defined, the shielding effect of the first central ground C1 and the second central ground C2 may be enhanced. Accordingly, when the plurality of via holes V1, V2, V3, and V4 are alternately defined, as a distance between the third via hole V3 and the fourth via hole V4, which are disposed in the shielding part 30, decrease, the shielding effect of the flexible printed circuit board may be maximized.

Figure 12:
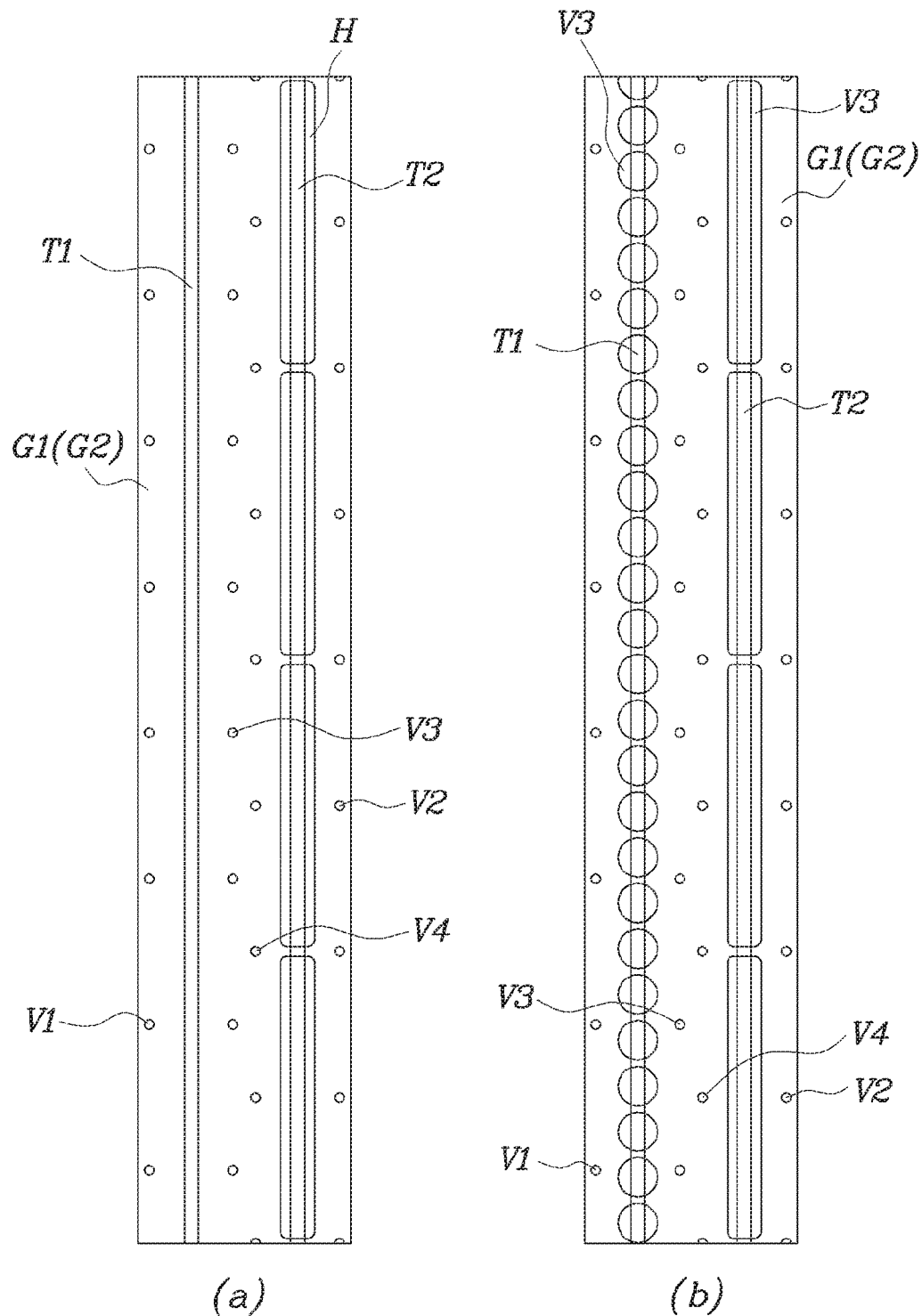
FIGS. 12A and 12B are views illustrating embodiments, which are different from each other, of a ground hole of the flexible printed circuit board that is one main portion of the present invention.

As illustrated in FIG. 12A, in the flexible printed circuit board in which the first signal line T1 and the second signal line T2 are provided in different layers from each other, a ground hole H having a rectangular shape is desirably defined in the first ground layer G1 or the second ground layer G2, which is disposed adjacent to the first signal line T1 and the second signal line T2 in the vertical direction.

As illustrated in FIG. 12B, desirably, a ground hole H having a rectangular shape is defined in the first ground layer G1 or the second ground layer G2, which is disposed adjacent to the first signal line T1 and the second signal line T2 in the vertical direction, and a ground hole H having a circular shape is defined in the first ground layer G1 or the second ground layer G2, which is disposed relatively away from the first signal line T1 and the second signal line T2 in the vertical direction. In this case, as the area of each of the first signal line T1 and the second signal line T2 increases, the flexible printed circuit board may minimize the signal loss.

FIGS. 13A to 13D are views illustrating a state in which the ground hole H is defined in the first to fourth embodiments of the flexible printed circuit board, which is one main portion of the present invention.

Figure 13:
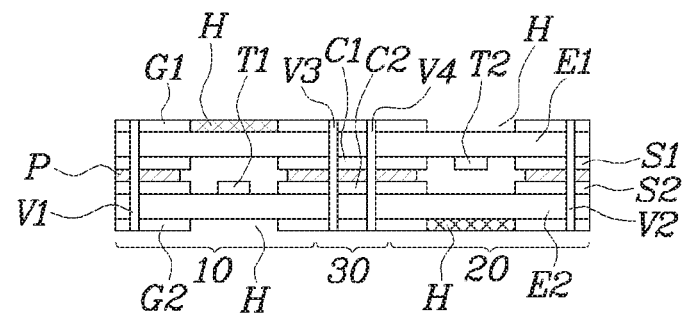
FIGS. 13A to 13D are views illustrating a state in which a ground hole is defined in first to fourth embodiments of the flexible printed circuit board that is one main portion of the present invention.
Figure 13:
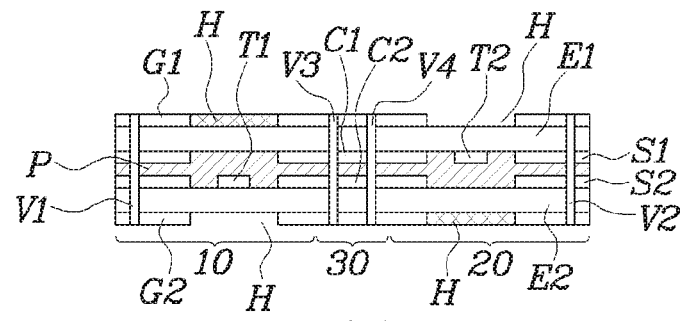
Figure 13:
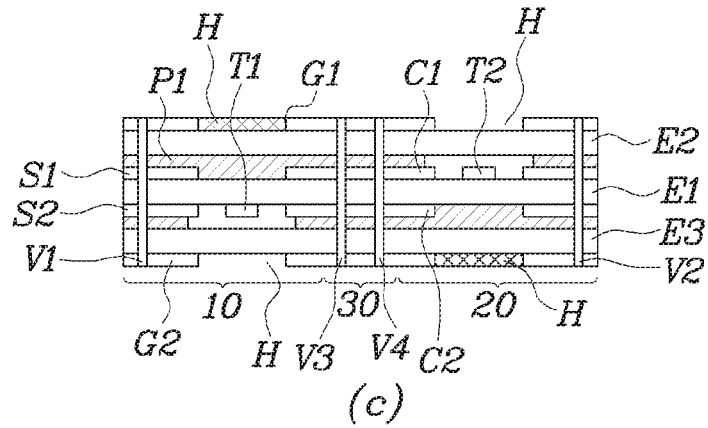
Figure 13:
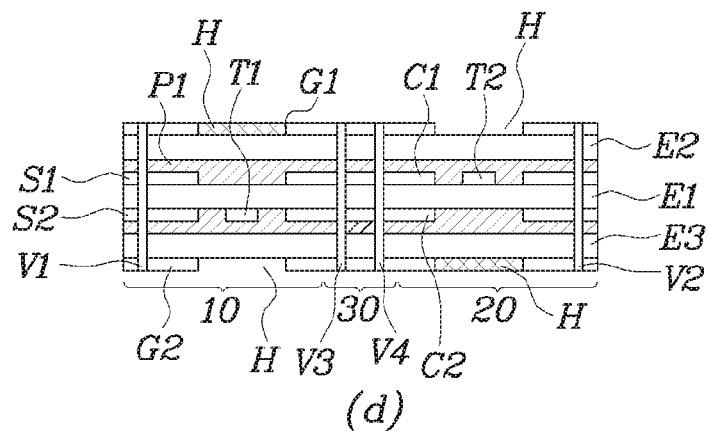

As illustrated in FIGS. 13A and 13B, when the ground hole H is defined in the first and second embodiments of the flexible printed circuit board, which is one main portion of the present invention, in the region of the first substrate part 10, the ground hole H having a rectangular shape is defined in the second ground layer G2 disposed adjacent to the first signal line T1, and the ground hole H having a circular shape is defined in the first ground layer G1 disposed away from the first signal line T1. Also, in the region of the second substrate part 20, the ground hole H having a rectangular shape is defined in the first ground layer G1 disposed adjacent to the second signal line T2, and the ground hole H having a circular shape is defined in the second ground layer G2 disposed away from the second signal line T2.

As illustrated in FIGS. 13C and 13D, when the ground hole H is defined in the third and fourth embodiments of the flexible printed circuit board, which is one main portion of the present invention, in the region of the first substrate part 10, the ground hole H having a rectangular shape is defined in the second ground layer G2 disposed adjacent to the first signal line T1, and the ground hole H having a circular shape is defined in the first ground layer G1 disposed away from the first signal line T1. Also, in the region of the second substrate part 20, the ground hole H having a rectangular shape is defined in the first ground layer G1 disposed adjacent to the second signal line T2, and the ground hole H having a circular shape is defined in the second ground layer G2 disposed away from the second signal line T2.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

Hence, the real protective scope of the present invention shall be determined by the technical scope of the accompanying claims.

INDUSTRIAL APPLICABILITY

The present invention provides a laptop computer, which realizes an extended display area and a small thickness by applying a flexible printed circuit board on the back of a display part. In particular, the present invention provides a laptop computer applied with a flexible printed circuit board, which realizes a small thickness by planar-arranging a plurality of signal lines in parallel to each other and minimizes signal interference and signal loss. Thus present invention has industrial applicability.

The invention claimed is:

1. A laptop computer, comprising:
   a main body part comprising a mainboard and a coaxial cable, one end of the coaxial cable is connected to the mainboard; and
   a display part hinge-coupled with the main body part and comprising a display and a flexible printed circuit board, wherein the flexible printed circuit board is installed on the back of the display and one end of the flexible printed circuit board is coupled with the other end of the coaxial cable.

2. The laptop computer of claim 1, wherein the display part further comprises:
   a lower bezel disposed below the display and in which the other end of the coaxial cable is coupled with the one end of the flexible printed circuit board; and
   an upper bezel disposed above the display and in which the other end of the flexible printed circuit board is coupled with an antenna.

3. The laptop computer of claim 2, wherein the coaxial cable and the flexible printed circuit board are coupled through one selected from a connector or soldering, and the flexible printed circuit board has a "T"-shape.

4. The laptop computer of claim 3, further comprising, a first antenna and a second antenna, which are respectively connected to the other end of the flexible printed circuit board in left and right directions.

5. The laptop computer of claim 3, further comprising, a first antenna and a second antenna, which are respectively formed to extend from the other end of the flexible printed circuit board in left and right directions.

6. The laptop computer of claim 4 or claim 5, wherein a pair of flexible printed circuit boards are installed on the back of the display, and a pair of first antennas and a pair of second antennas are provided,
   wherein the pair of first antennas transceive a short range communication signal, and
   wherein the pair of second antennas transceive a wireless mobile communication signal and disposed between the pair of first antennas.

7. The laptop computer of claim 1, wherein the flexible printed circuit board comprises a first substrate part comprising a first signal line, and a second substrate part comprising a second signal line in parallel to the first signal line, and wherein the first substrate part and the second substrate part are disposed on the same plane with a shielding part therebetween.

* * * * *